US010125731B2

(12) United States Patent
Autret et al.

(10) Patent No.: US 10,125,731 B2
(45) Date of Patent: Nov. 13, 2018

(54) ANTI-ROTATION DEVICE OF A FUEL LANCE

(71) Applicant: DELPHI TECHNOLOGIES IP LIMITED, St. Michael (BB)

(72) Inventors: Emmanuel Autret, Marolles (FR); Fabrizio A. Bonfigli, Mont pres Chambord (FR); Julien Nourisson, Olivet (FR)

(73) Assignee: DELPHI TECHNOLOGIES IP LIMITED (BB)

( * ) Notice: Subject to any disclaimer, the term of this patent is extended or adjusted under 35 U.S.C. 154(b) by 0 days.

(21) Appl. No.: 15/524,698

(22) PCT Filed: Nov. 6, 2015

(86) PCT No.: PCT/EP2015/075919

§ 371 (c)(1),
(2) Date: May 5, 2017

(87) PCT Pub. No.: WO2016/071496

PCT Pub. Date: May 12, 2016

(65) Prior Publication Data

US 2017/0321642 A1 Nov. 9, 2017

(30) Foreign Application Priority Data

Nov. 7, 2014 (FR) ...................................... 14 60771

(51) Int. Cl.
*F02M 55/02* (2006.01)
*F02M 55/00* (2006.01)

(52) U.S. Cl.
CPC .......... *F02M 55/02* (2013.01); *F02M 55/002* (2013.01); *F02M 2200/852* (2013.01); *F02M 2200/855* (2013.01); *H05K 999/99* (2013.01)

(58) Field of Classification Search
CPC ...... F02M 55/02; F02M 61/14; F02M 61/145; F02M 69/462; F02M 55/002; F02M 2200/855; F02M 2200/852; H05K 999/99
(Continued)

(56) References Cited

U.S. PATENT DOCUMENTS 3,845,748 A * 11/1974 Eisenberg ............ F02M 55/002 123/468
5,365,907 A * 11/1994 Dietrich .................. F02F 1/242 123/468

(Continued)

FOREIGN PATENT DOCUMENTS

AT 291785 B 7/1971
JP 2002174272 A 6/2002

*Primary Examiner* — Hai Huynh
(74) *Attorney, Agent, or Firm* — Joshua M. Haines

(57) ABSTRACT

The invention relates to an anti-rotation device of a fuel lance arranged in a bore extending through a cylinder head of a cylinder head from an intake opening until a hole provided for receiving a fuel injector, the lance allowing high-pressure fuel to circulate from an intake opening of the lance until the outlet opening of the lance engaging with the intake opening of the fuel injector, the fuel lance including a nut for being screwed into the intake opening of the bore and a tubular member compressed between the nut and the injector, the lance also including the anti-rotation device. The anti-rotation device is a resilient element which is deformed by rotation of the nut, such as to be blocked between the tubular member and an inner wall of the bore, and thus prevent rotation of the tubular member when the nut is screwed.

4 Claims, 4 Drawing Sheets

(58) Field of Classification Search
USPC .......................................... 123/468, 469, 470
See application file for complete search history.

(56) References Cited

U.S. PATENT DOCUMENTS

| | | | | |
|---|---|---|---|---|
| 5,617,828 | A * | 4/1997 | Kuegel ................ | F02M 55/005 123/468 |
| 5,775,303 | A * | 7/1998 | Sweetland ............ | F02M 61/14 123/470 |
| 6,199,539 | B1 | 3/2001 | Pearlman et al. | |
| 6,279,540 | B1 | 8/2001 | Greaney et al. | |
| 6,431,150 | B1 | 8/2002 | Pearlman et al. | |
| 6,536,417 | B2 * | 3/2003 | Pearlman ............. | F02M 55/005 123/470 |
| 8,640,673 | B2 * | 2/2014 | Male .................... | F02M 55/005 123/469 |
| 8,695,572 | B2 * | 4/2014 | Guido .................. | F02M 55/002 123/468 |
| 9,239,035 | B2 * | 1/2016 | Guido .................. | F02M 55/002 |
| 2004/0061332 | A1 | 4/2004 | Takayanagi et al. | |
| 2009/0183713 | A1 | 7/2009 | Bonfigli et al. | |
| 2012/0012083 | A1 | 1/2012 | Tower et al. | |
| 2014/0273582 | A1 | 9/2014 | Arcykiewicz | |

* cited by examiner

ANTI-ROTATION DEVICE OF A FUEL LANCE

CROSS REFERENCE TO RELATED APPLICATIONS

This application is a national stage application under 35 USC 371 of PCT Application No. PCT/EP2015/075919 having an international filing date of Nov. 6, 2015, which is designated in the United States and which claimed the benefit of FR Patent Application No. 1460771 filed on Nov. 7, 2014, the entire disclosures of each are hereby incorporated by reference in their entirety.

TECHNICAL FIELD

The present invention relates to an anti-rotation device used in a fuel lance which supplies a fuel injector at high pressure.

TECHNOLOGICAL BACKGROUND OF THE INVENTION

In an internal combustion engine, a fuel pump supplies each cylinder of the engine with fuel at high pressure by means of dedicated fuel injector. Typically, the fuel injector is fitted in a bore provided in a cylinder head, and a fuel lance is used to provide a fluid connection between the injector and the supply duct coming from the fuel pump.

This type of assembly is known from EP0974749 and is shown in FIG. 1. A fuel lance 10 comprises a tubular member 22, with a first end 46 which is designed to cooperate with the seat 16 of an injector 12, and a second end 48 which is formed in order to define a frusto-conical seat 24. A securing nut 26 is partially inside an end of a bore 20, with the securing nut 26 comprising an inner end region 28 which is designed to cooperate with the seat 24.

The securing nut 26 comprises an outer threaded region 30. The thread 30 is designed to cooperate with threads of screws formed in the end 48 of the bore 20. In use, the securing nut 26 is secured inside the end 48 of the bore 20. The inner end 28 of the securing nut 26 cooperates with the seat 24 of the tubular element 22, by applying a compression force against the tubular member 22 in order to form a seal, both between the tubular member 22 and the seat 16 of the injector 12, and between the nut 26 and the tubular member 22.

The tubular member 22 and the securing nut 26 each comprise passages which extend axially, and together define a flow path. The fuel can flow through the fuel lance 10 to the supply passage 18 of the injector 12 from a high-pressure fuel hose 34 which is secured on the securing nut 26 by means of a standard securing tube 36. As illustrated in FIG. 1, the bore in the securing nut 26 extends axially, and comprises a region with a larger diameter which receives a filter element with a slot 38 designed to filter the undesirable particles which come from the flow of fuel towards the injector 12.

The head 14 comprises a passage 42 which communicates with the bore 20, with the passage 42 allowing the low-pressure fuel to flow from the injector 12 through the bore 20, towards a low-pressure fuel tank (not described). The securing nut 26 comprises a proximal recess in the threaded region 30, which positions an annular sealing element 32, designed to form a seal against the fluids, between the securing nut 26 and the wall of the head 14 which defines the bore 20.

A problem which exists concerning the high-pressure fuel supply device is that the sealing between the fuel lance and the injection nozzle requires tightening of a securing screw in the head, and transfer of the load of the screw to the fuel lance. This mechanism also gives rise to rotation of the parts, and generation of undesirable particles in the form of debris, which could lead to contamination of the fuel and wear of the components.

In order to solve this problem, the invention consists of an anti-rotation device for the fuel lance, in order to prevent its rotation inside the head, and thus to transmit the required load better.

SUMMARY OF THE INVENTION

The objective of the present invention is to solve the problems previously described by proposing a solution which is simple and easy to assemble.

For this purpose, the invention proposes an anti-rotation device of a fuel lance. The lance can be arranged in a bore which extends through a cylinder head, from an intake orifice to a pit which is provided in order to receive a fuel injector. The lance is designed to allow high-pressure fuel to circulate from an intake mouth of the lance to the outlet mouth of the lance cooperating with the intake mouth of the fuel injector. The fuel lance comprises a nut which is designed to be screwed into an intake orifice in the bore, and a tubular member compressed between said nut and the injector. The lance additionally comprises the anti-rotation device which can prevent the rotation of the tubular member when the nut is screwed.

The anti-rotation device is a resilient element which is deformed as soon as rotation of the nut begins, such as to be blocked between the tubular member and the inner wall of the bore, and thus prevent the rotation of the tubular member. In addition, the resilient element can be arranged between the lance and the bore. According to a first embodiment, the resilient element is a torsion spring which is wound in a cylindrical helix around the tubular member. In addition, the torsion spring comprises a lug at one end, the lug being anchored in a groove provided in the proximal bore in the intake mouth of the bore. A second embodiment is characterized in that the resilient element is a double torsion spring wound in a cylindrical helix around the tubular member. The double torsion spring comprises two lugs respectively at each end, the two lugs being anchored in the groove in the bore. The fuel lance also comprises the anti-rotation device as described in the different embodiments. In addition, an internal combustion engine comprises an injector supplied by the fuel lance as previously described in the different embodiments.

BRIEF DESCRIPTION OF THE DRAWINGS

Other characteristics, objectives and advantages of the invention will become apparent from reading the following detailed description, and with reference to the appended drawings provided by way of non-limiting example, in which.

DESCRIPTION OF THE PREFERRED EMBODIMENTS

Figure 1:
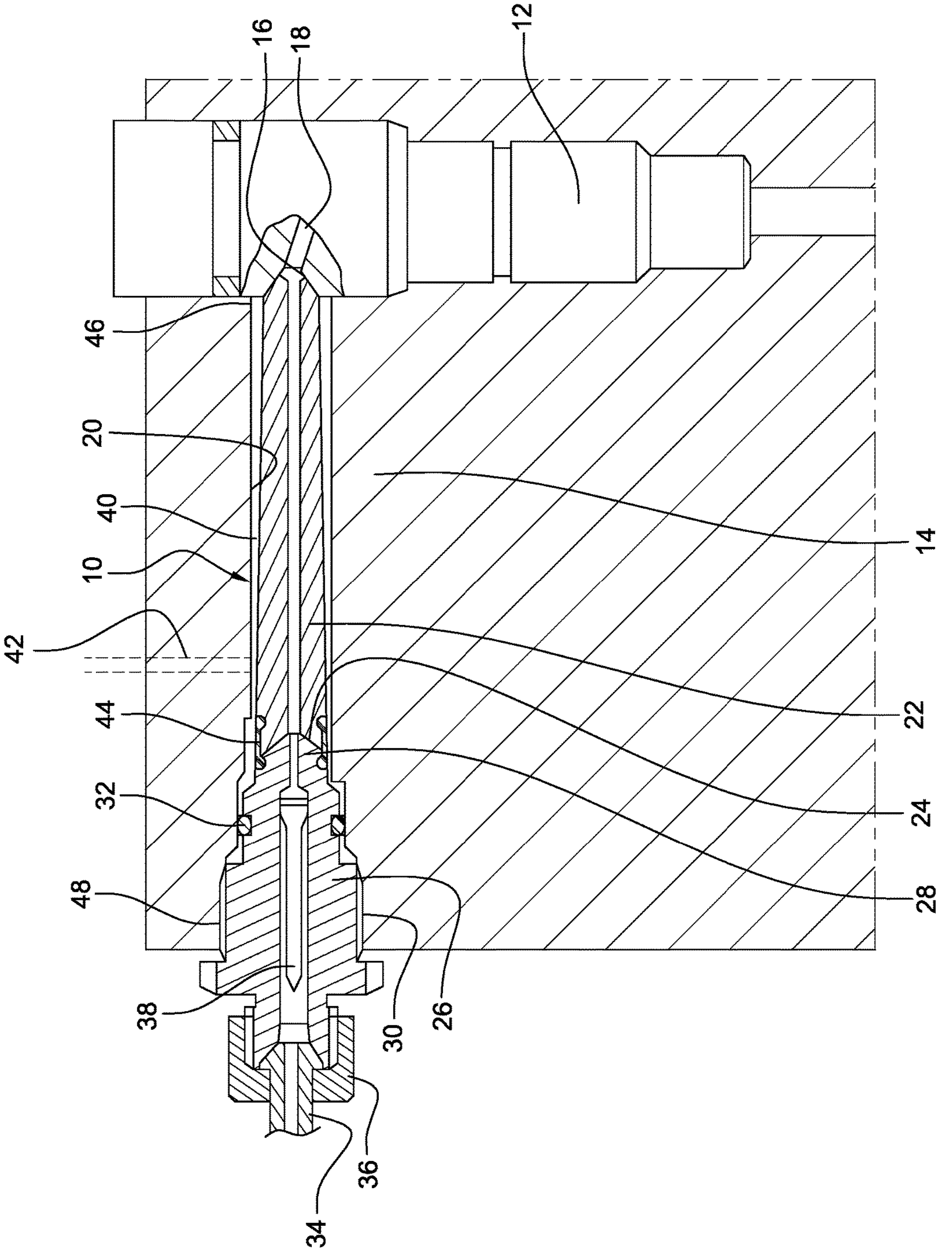
FIG. 1 is a view in cross section of a known fuel lance.
Figure 2:
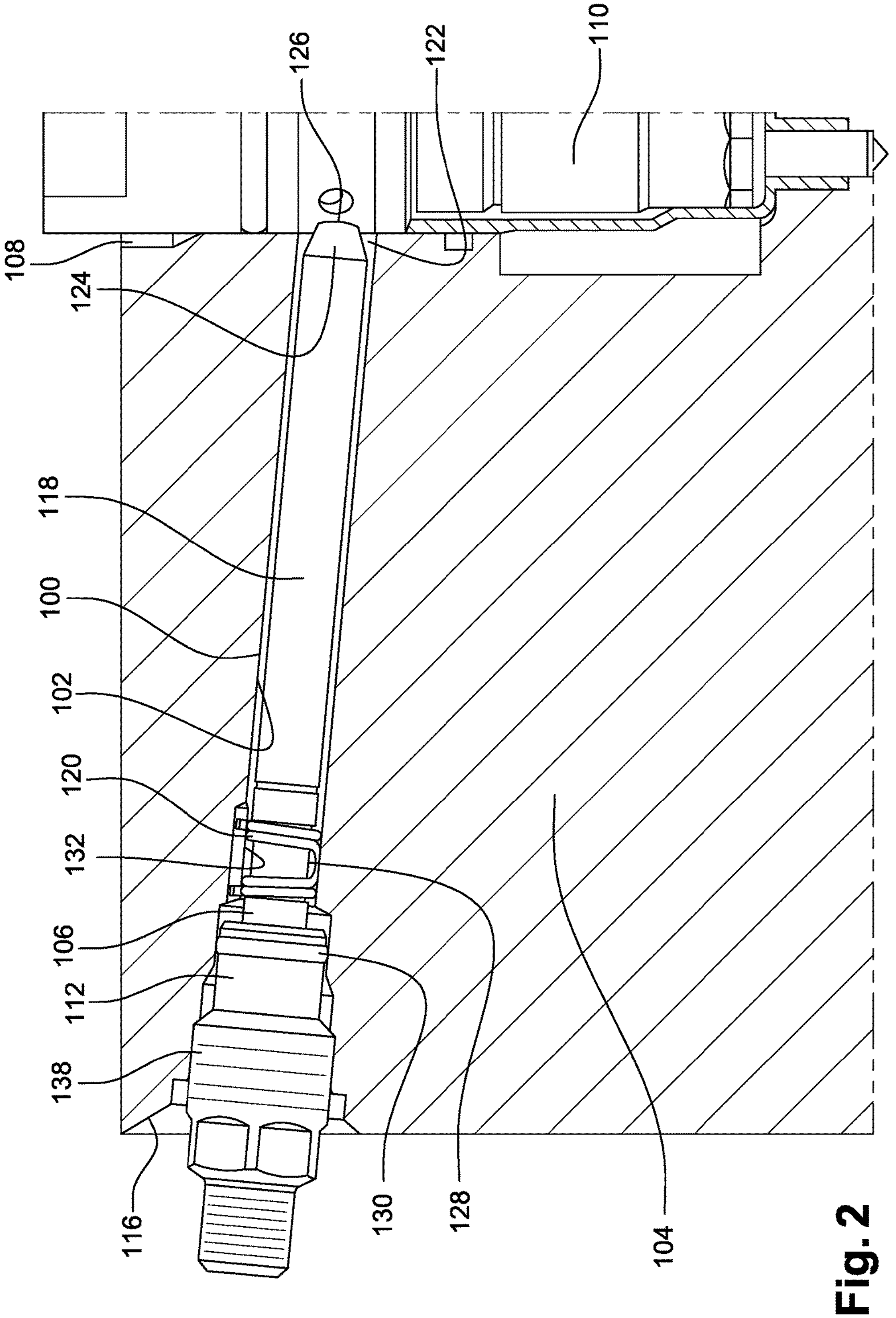
FIG. 2 is a view in cross section of the fuel injector lance assembly according to the invention.

As illustrated in FIG. 2, the fuel lance 100 is arranged in a long bore 102 pierced in a top engine 104 also known as a cylinder head. The fuel lance 100 extends from an intake orifice 116 to a pit 108 which is provided in order to receive a fuel injector 110.

The fuel lance 100 comprises a tubular member 118, which is arranged in the long bore 102, a securing nut 112 which cooperates with the tubular member 118, and an anti-rotation device 120 fitted on the tubular member.

Figures 5, 6:
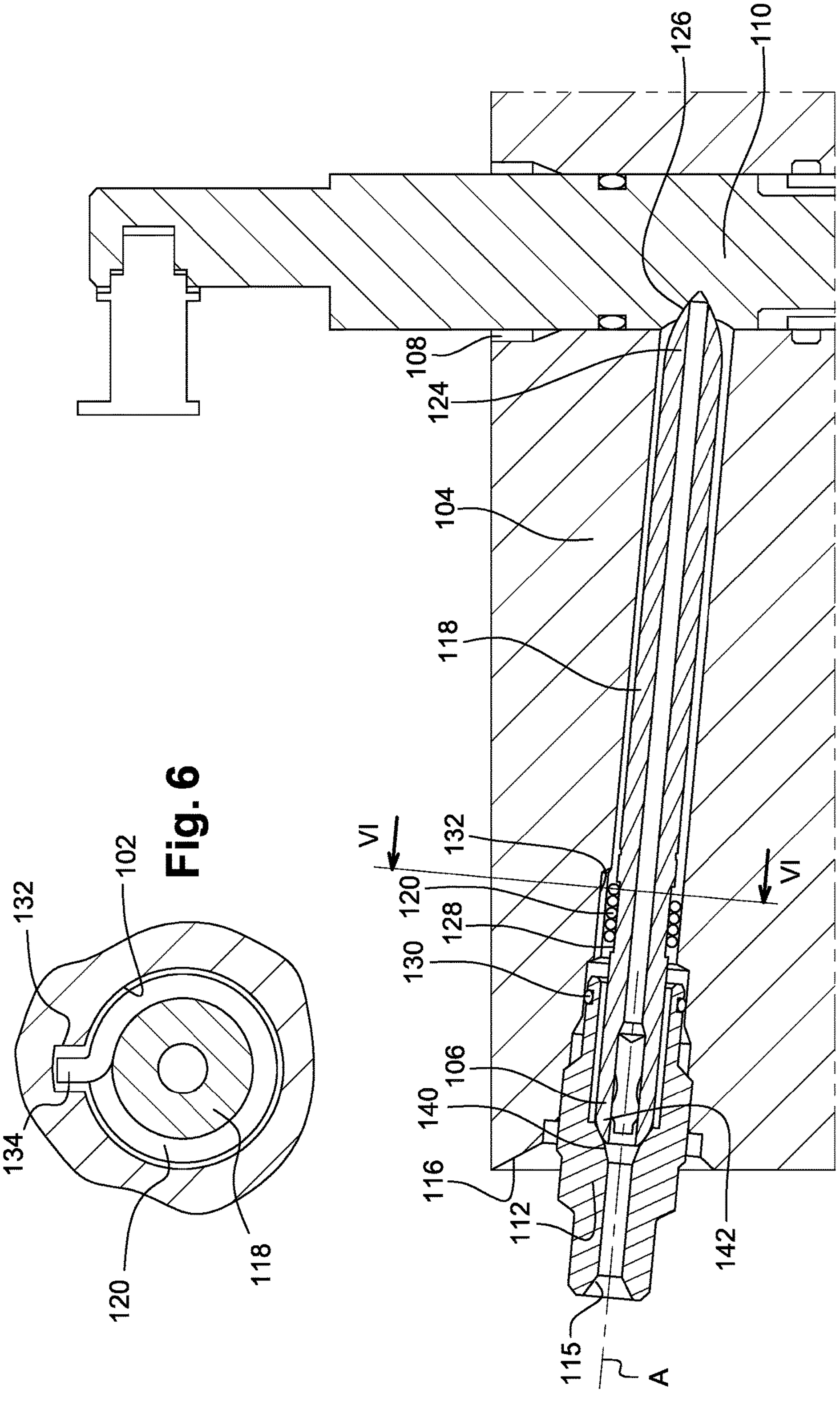
FIG. 5 is a view in cross section of the tubular member and the securing nut.
FIG. 6 is a view in cross section according to the axis VI represented in FIG. 5.

The tubular member 118 extends along the long bore 102, from the intake orifice 116 of the head 104 as far as an outlet orifice 122 of the head 104 which opens into the pit 108. The tubular member 118 comprises an intake mouth 106 and an outlet mouth 124. As illustrated in FIG. 5, the intake mouth 106 has an end 142 with a male spherical form, the top of which is cut off. The outlet mouth 124 has a surface with a male spherical form. The outlet mouth 124 cooperates with an intake mouth 126 of the injector 110 which has a surface with a female conical form. The tubular member 118 has a cylindrical form. The tubular member 118 comprises a proximal channel 128 in the intake orifice 116 of the head 104, in order to receive an anti-rotation device 120.

In FIG. 2, the securing nut 112 is fitted on the proximal intake mouth 106 of the tubular member 118 of the intake orifice 116 of the head 104. The nut 112 is partially on the exterior of the intake orifice 116. As illustrated in FIG. 5, the securing nut 112 comprises a recess in order to receive a seal 130. The seal 130 is designed to form a seal against fuel between the securing nut 112 and the surface of the head 104 which delimits the long bore 102. The seal 130 is distal relative to the outlet mouth 124 of the lance 100 in contact with the injector 110. As illustrated in FIG. 5, the securing nut 112 comprises a region threaded on the exterior 138, which is designed to cooperate with the screw threads formed in the intake orifice 116 of the head 104. In its interior, the nut 112 comprises a bore with an end 115 in the form of a distal cone of the tubular member 118, and an end 140 in the form of a female cone. The inner end 140 of the securing nut 112 which is oriented towards the interior of the long bore 102 cooperates with the intake mouth 106 of the tubular member 118. The cone of the inner end 140 is in axial compression against the end 142.

The anti-rotation device 120 is a resilient element which is deformed as soon as the rotation of the securing nut 112 begins. The resilient element is arranged between the lance 100 and the bore 102. The anti-rotation device 120 is fitted around the channel 128 in the tubular member 118, at a proximal distance from the intake mouth 106. The anti-rotation device 120 is in contact with a groove 132 provided in the bore 102 in the head 104 of the cylinder.

Figure 3:
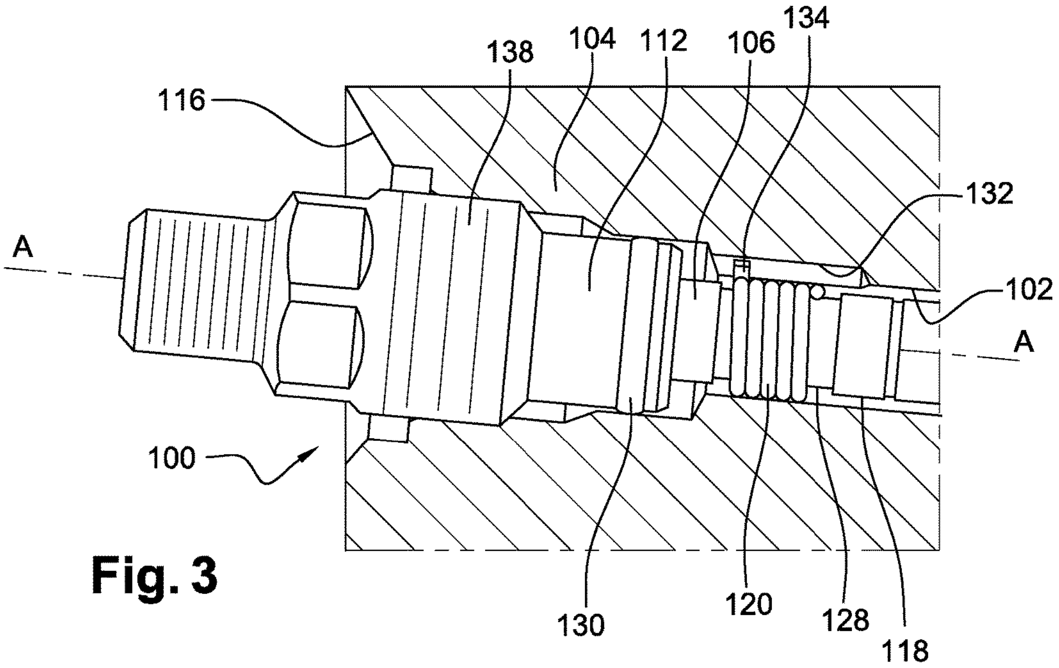
FIG. 3 is a view in cross section of the anti-rotation device with a torsion spring according to the invention.

In a first embodiment illustrated in FIG. 3, the anti-rotation device 120 is a torsion spring which is wound in a cylindrical helix around the tubular member 118. The spring 120 is in contact both with the channel 128 provided in an outer surface of the tubular member 118, and the groove 132 provided in the bore 102. The torsion spring 120 comprises a lug 134 at one end. As illustrated in FIG. 6, the lug 134 is anchored in the groove 132 in the bore 102, which means that the lug is inserted in the groove, and can exert rotation in the groove around the main axis A. The spring 120 has two positions, i.e. a first, released position when the spring 120 is at rest, and a second, constrained position when tightening torsion torque is applied. The direction of winding of the torsion spring 120 is to the right, i.e. the helix rises to the right. The following information is provided by way of example in order to illustrate the first embodiment. The length of the fuel lance is substantially equal to 100 mm. The length of the securing nut is substantially equal to 55 mm, with a diameter substantially equal to 22 mm. The diameter of the bore 102 is substantially equal to 12 mm. The spring has a length substantially equal to 12 mm, with a number of 5 turns. The winding to the right of the spring 120 is used for screwing of the fuel lance 100.

Figure 4:
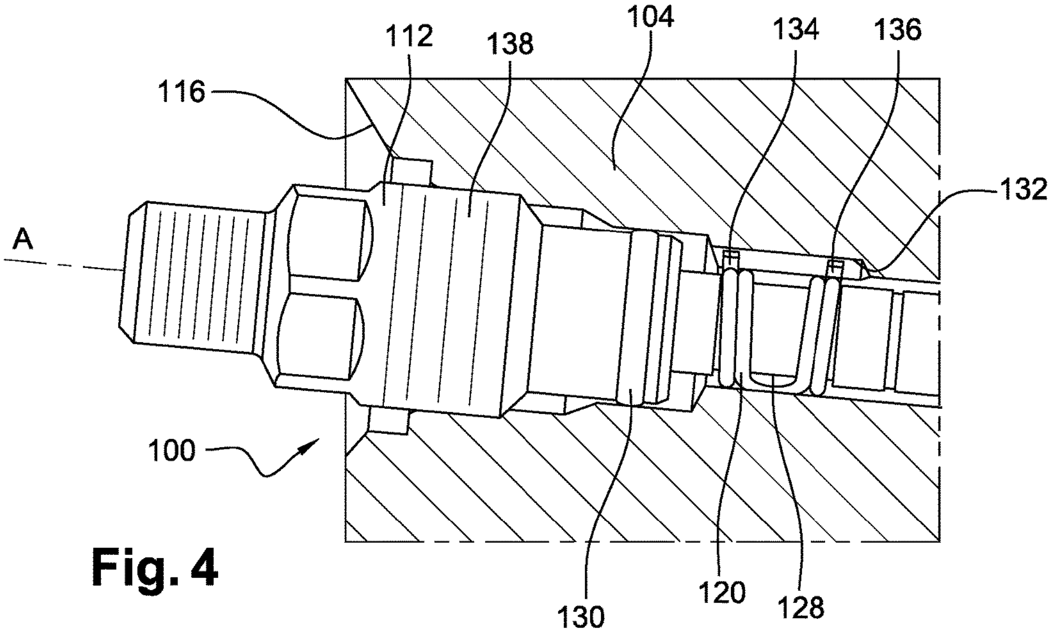
FIG. 4 is a view in cross section of the anti-rotation device with a double spring according to the invention.

According to a second embodiment illustrated in FIG. 4, the anti-rotation device 120 is a double spring wound on the tubular element 118. The torsion spring 120 which is wound in a cylindrical helix is provided with two lugs 134, 136 respectively, situated at the two ends of the spring 120. The first lug 134 is anchored in the groove 132 in the bore 102, and the second lug 136 is anchored in the groove 132 in the bore 102, which groove is distal relative to the first lug 134. The two lugs 134, 136 are anchored, which means that they are inserted in the groove, and can turn around the main axis A. The spring 120 has two positions, i.e. a first, released position when the spring 120 is at rest, and a second, constrained position when a tightening or untightening torque is applied. The spring 120 has two opposite windings. The two windings can have either an identical number of turns or a different number of turns. Similarly, the angular rigidities of the two windings can be identical or different. The direction of one of the two windings of the spring 120 is to the right for the screwing of the fuel lance 100, and the direction of the other winding is to the left for the unscrewing of the fuel lance 100. The following information is provided by way of example in order to illustrate the second embodiment. The length of the fuel lance is substantially equal to 100 mm. The length of the securing nut is substantially equal to 55 mm with a diameter substantially equal to 22 mm. The diameter of the bore 102 is substantially equal to 12 mm. The double spring 120 has a length substantially equal to 23 mm with a total number of 10 turns, i.e. 5 turns in one direction of winding of the spring 120, and 5 turns in the other direction of winding. The winding to the right of the double spring 120 is used for the screwing of the fuel lance 100, and the winding to the left is used for the unscrewing of the fuel lance 100. If the screwing of the fuel lance 100 is selected to be anticlockwise, then the screw pitch is to the left. Thus, the double torsion spring 120 has a first direction of winding to the left of the double spring 120 for the screwing, and a second direction of winding to the right of the double spring 120 for the unscrewing of the fuel lance 100.

In the first embodiment, during the screwing of the nut 112, the torsion spring 120 turns around its main axis A in the direction of screwing, until contact takes place between the lug 134 and the groove 132 in the bore 102 in the head 104. The spring 120 is tightened around the tubular element 118 during the rotation of the nut 112, whilst being compressed until the rotation of the tubular element 118 is blocked. When the screwing is stopped, the spring 120 remains tightened on the tubular member 118, and the lug 134 remains in contact with the groove 132.

In the second embodiment, when the nut 112 is screwed, the double torsion spring 120 begins the rotation around its main axis A until contact takes place between the lug 134 and the groove 132 in the bore 102 in the head 104. The spring 120 is tightened around the tubular element 118 with one of the turn windings during the rotation of the nut 112, whilst being compressed, and the spring 120 blocks the rotation of the tubular element 118. When the screwing is stopped, the spring 120 remains tightened on the tubular element 118, and the lug 134 remains in contact with the groove 132. If there is unscrewing of the securing nut 112, the torsion spring 120 is untightened from around the tubular member 118 for the winding to the right, whereas the winding to the left progressively tightens on the tubular member 118 by means of the contact between the lug 136 and the groove 132 in the bore 102 in the head 104, until the rotation of the tubular member 118 is blocked. Thus, the nut 112 can be untightened without rotation of the tubular member 118, and the generation of undesirable particles will also be avoided during the untightening.

In order to assemble the fuel lance 100, the resilient element 120 is fitted by placing it around the tubular member 118 via the end 106 as far as the channel 128 in the tubular element 118, which channel is proximal relative to the end 106 which receives the securing nut 112. The resilient element 120 is fitted tightened on the tubular element 118. The fuel lance 100 is then fitted in the bore 102 in the head 104, the end 124 of which opens into an outlet orifice 122 cooperating with the intake mouth 126 of the injector 110 with a female cone. During the fitting of the nut 112 on the fuel lance 100, the nut 112 is screwed into the threaded area 138 of the bore 102. The interior end 140 of the nut 112 comes into contact with the end 142 of the intake mouth 106 of the tubular element 118. When the securing nut 112 is screwed into the bore 102, the fuel lance 100 begins to turn around its main axis A until the anti-rotation device 120 prevents the rotation of the tubular member 118, when the nut 112 is screwed. The resilient element 120 is then tightened on the tubular element 118, and blocks its rotation. The securing nut 112 then receives the fuel duct via the intake orifice 115, which is not represented in the figures.

The invention claimed is:

1. An anti-rotation device of a fuel lance, the fuel lance being able to be arranged in a bore which extends through a cylinder head from an intake orifice to a pit which is provided in order to receive a fuel injector, the fuel lance being designed to allow high-pressure fuel to flow from an intake mouth of the fuel lance to an outlet mouth of the fuel lance which cooperates with an intake mouth of the fuel injector, the fuel lance comprising a nut which is designed to be screwed into the intake orifice in the bore, and a tubular member compressed between the nut and the fuel injector, the fuel lance additionally comprising the anti-rotation device, wherein the anti-rotation device is a resilient element which is deformed by rotation of the nut, so as to be blocked between the tubular member and an inner wall of the bore, and thus prevent rotation of the tubular member when the nut is screwed, wherein the anti-rotation device is a torsion spring which is wound in a cylindrical helix around the tubular member, and wherein the torsion spring comprises a lug at one end, the lug being anchored in a groove provided in the bore.

2. An anti-rotation device of a fuel lance, the fuel lance being able to be arranged in a bore which extends through a cylinder head from an intake orifice to a pit which is provided in order to receive a fuel injector, the fuel lance being designed to allow high-pressure fuel to flow from an intake mouth of the fuel lance to an outlet mouth of the fuel lance which cooperates with an intake mouth of the fuel injector, the fuel lance comprising a nut which is designed to be screwed into the intake orifice in the bore, and a tubular member compressed between the nut and the fuel injector, the fuel lance additionally comprising the anti-rotation device, wherein the anti-rotation device is a resilient element which is deformed by rotation of the nut, so as to be blocked between the tubular member and an inner wall of the bore, and thus prevent rotation of the tubular member when the nut is screwed, wherein the anti-rotation device is a double torsion spring wound in a cylindrical helix around the tubular member, and wherein the double torsion spring comprises two lugs respectively at each end, the two lugs being anchored in a groove in the bore.

3. A fuel lance to be arranged in a bore which extends through a cylinder head from an intake orifice to a pit which is provided in order receive a fuel injector, the fuel lance comprising:

a tubular member having an intake mouth and an outlet mouth such that the tubular member allows high-pressure fuel to flow from the intake mouth of the tubular member to the outlet mouth of the tubular member which cooperates with an intake mouth of the fuel injector;

a nut which is to be screwed into the intake orifice in the bore, thereby compressing the tubular member between the nut and the fuel injector; and an anti-rotation device which is a resilient element deformed by rotation of the nut, such that the anti-rotation device is blocked between the tubular member and an inner wall of the bore and prevents rotation of the tubular member when the nut is screwed, wherein the anti-rotation device is a torsion spring which is wound in a cylindrical helix around the tubular member, and wherein the torsion spring comprises a lug at one end, the lug being anchored in a groove provided in the bore.

4. A fuel lance to be arranged in a bore which extends through a cylinder head from an intake orifice to a pit which is provided in order receive a fuel injector, the fuel lance comprising:

a tubular member having an intake mouth and an outlet mouth such that the tubular member allows high-pressure fuel to flow from the intake mouth of the tubular member to the outlet mouth of the tubular member which cooperates with an intake mouth of the fuel injector;

a nut which is to be screwed into the intake orifice in the bore, thereby compressing the tubular member between the nut and the fuel injector; and an anti-rotation device which is a resilient element deformed by rotation of the nut, such that the anti-rotation device is blocked between the tubular member and an inner wall of the bore and prevents rotation of the tubular member when the nut is screwed, wherein the anti-rotation device is a double torsion spring wound in a cylindrical helix around the tubular member, and wherein the double torsion spring comprises two lugs respectively at each end, the two lugs being anchored in a groove in the bore.

* * * * *